United States Patent
Chung et al.

(10) Patent No.: US 9,196,833 B2
(45) Date of Patent: Nov. 24, 2015

(54) METHOD OF MANUFACTURING ORGANIC LIGHT-EMITTING DISPLAY APPARATUS USING MASK SCANNING DEPOSITION TECHNIQUE

(71) Applicant: Samsung Display Co., Ltd., Yongin (KR)

(72) Inventors: Jin-Koo Chung, Yongin (KR); Jun-Ho Choi, Yongin (KR); Seong-Min Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/100,662

(22) Filed: Dec. 9, 2013

(65) Prior Publication Data

US 2014/0357002 A1 Dec. 4, 2014

(30) Foreign Application Priority Data

Jun. 4, 2013 (KR) .......................... 10-2013-0064320

(51) Int. Cl.
| | | |
|---|---|---|
| H01L 51/40 | (2006.01) | |
| H01L 51/00 | (2006.01) | |
| C23C 14/04 | (2006.01) | |
| H01L 29/08 | (2006.01) | |
| H01L 35/24 | (2006.01) | |
| H01J 63/04 | (2006.01) | |
| H01L 51/50 | (2006.01) | |

(52) U.S. Cl.
CPC .......... *H01L 51/0011* (2013.01); *C23C 14/042* (2013.01); *H01L 51/50* (2013.01)

(58) Field of Classification Search
None
See application file for complete search history.

(56) References Cited

U.S. PATENT DOCUMENTS

| | | | |
|---|---|---|---|
| 2011/0031500 A1* | 2/2011 | Suh .................................. | 257/59 |
| 2011/0048320 A1 | 3/2011 | Choi et al. | |
| 2011/0266944 A1* | 11/2011 | Song et al. ..................... | 313/504 |

FOREIGN PATENT DOCUMENTS

| | | |
|---|---|---|
| KR | 10-2005-0017539 | 2/2005 |
| KR | 10-2011-0025035 | 3/2011 |

\* cited by examiner

*Primary Examiner* — Michael Jung
(74) *Attorney, Agent, or Firm* — H.C. Park & Associates, PLC

(57) ABSTRACT

A method of manufacturing an organic light-emitting display apparatus includes: forming light-emitting regions on a substrate; forming an organic light-emitting layer on the light-emitting regions; forming a counter electrode on the organic light-emitting layer; and forming an auxiliary electrode electrically connected to the counter electrode. A thickness of the auxiliary electrode is different from a thickness of the counter electrode. Formation of the counter electrode and formation of the auxiliary electrode are achieved via a small mask scanning (SMS) deposition method using the same mask.

12 Claims, 10 Drawing Sheets

METHOD OF MANUFACTURING ORGANIC LIGHT-EMITTING DISPLAY APPARATUS USING MASK SCANNING DEPOSITION TECHNIQUE

CROSS-REFERENCE TO RELATED APPLICATION

This application claims priority from and the benefit of Korean Patent Application No. 10-2013-0064320, filed on Jun. 4, 2013, which is incorporated by reference for all purposes as if set forth herein.

BACKGROUND

1. Field

Exemplary embodiments relate to a thin film deposition apparatus and a method of manufacturing an organic light-emitting display apparatus using the same, and, more particularly, to a thin film deposition apparatus that may be utilized to manufacture a relatively large light-emitting display apparatus and may simplify a manufacturing process for an organic light-emitting display apparatus, and a method of manufacturing an organic light-emitting display apparatus using the same.

2. Discussion

Conventional flat panel display apparatuses include, for instance, non-emissive display apparatuses, e.g., liquid crystal display apparatuses, electrophoretic display apparatuses, electrowetting display apparatuses, field emission display apparatuses, etc., and emissive display apparatuses, e.g., organic light-emitting display apparatuses, plasma display apparatuses, electroluminescence display apparatuses, etc. Among these flat panel display apparatuses, organic light-emitting display apparatuses electrically excite an organic compound to emit light for displaying images. Organic light-emitting display apparatuses may be operated at relatively low voltages, and, therefore, may be formed with a relatively thin profile. To this end, organic light-emitting display apparatuses may exhibit relatively wide viewing angles and comparatively faster response speeds than other flat panel display apparatuses.

Conventional organic light-emitting display apparatuses typically include a light-emitting layer disposed between a first electrode and a second electrode that face each other. In this manner, the electrodes and the light-emitting layer may be formed using any suitable method, such as, for example, one or more deposition-based methods. To this end, attempts have been made to realize a relatively large-sized display using organic light-emitting display technology; however, the interconnection resistance of a common electrode covering all pixels of such display apparatuses may increase.

The above information disclosed in this Background section is only for enhancement of understanding of the background of the invention, and, therefore, it may contain information that does not form the prior art that is already known in this country to a person of ordinary skill in the art.

SUMMARY

Exemplary embodiments provide a thin film deposition apparatus that may simplify a manufacturing process of an organic light-emitting display apparatus, and a method of manufacturing an organic light-emitting display apparatus using the same.

Additional aspects will be set forth in the detailed description which follows and, in part, will be apparent from the disclosure, or may be learned by practice of the invention.

According to exemplary embodiments, a method of manufacturing an organic light-emitting display apparatus, includes: forming light-emitting regions on a substrate; forming an organic light-emitting layer on the light-emitting regions; forming a counter electrode on the organic light-emitting layer; and forming an auxiliary electrode electrically connected to the counter electrode. A thickness of the auxiliary electrode is different from a thickness of the counter electrode. Formation of the counter electrode and formation of the auxiliary electrode are achieved via a small mask scanning (SMS) deposition method using the same mask.

According to exemplary embodiments, a thin film deposition apparatus, includes: a deposition source configured to discharge a deposition material; a substrate mounting unit disposed facing the deposition source, the substrate mounting unit being configured to support a substrate; and a mask disposed between the substrate mounting unit and the deposition source. The mask includes: a first patterning slit to form a counter electrode of a first thickness on the substrate in light-emitting regions of the substrate, and a second patterning slit to form an auxiliary electrode of a second thickness on the substrate in electrical connection with the counter electrode. The thin film deposition apparatus is configured to enable relative movement between the substrate and the mask in at least a scan direction.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
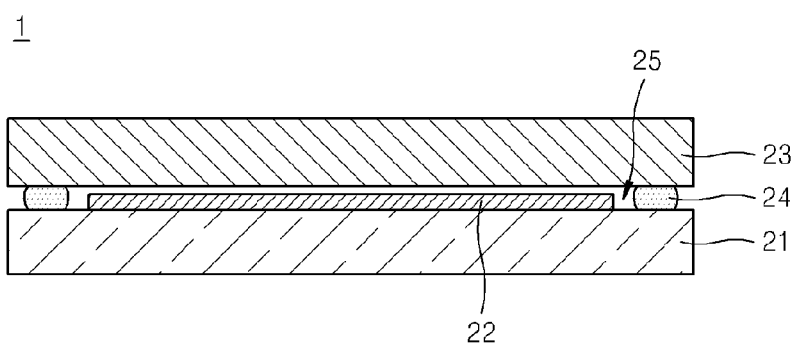
FIG. 1 is a cross-sectional view of an organic light-emitting display apparatus, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
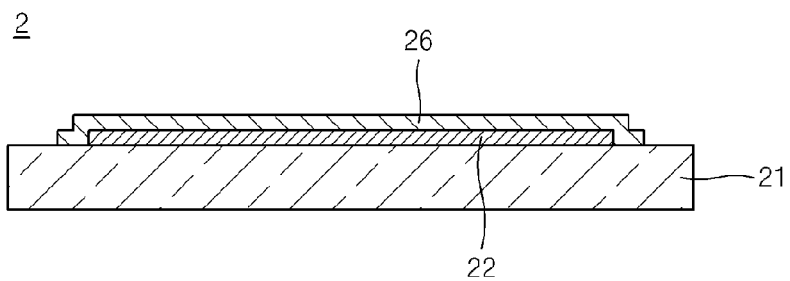
FIG. 2 is a cross-sectional view of an organic light-emitting display apparatus, according to exemplary embodiments.

FIGS. 1 and 2 are respective cross-sectional views of organic light-emitting display apparatuses, according to exemplary embodiments.

Referring to FIG. 1, an organic light-emitting display apparatus 1 includes, for example, an organic light-emitting unit 22 formed on a substrate 21 upon which a sealing substrate 23 is disposed to seal the organic light-emitting unit 22 therebetween.

The sealing substrate 23 may be formed of any suitable transparent member to allow an image from the organic light-emitting unit 22 to be obtained, and, thereby, presented to an observer. In this manner, the sealing substrate 23 may also serve to prevent (or otherwise reduce) the penetration of external gases (e.g., oxygen, nitrogen, etc.), moisture, and/or other contaminants.

Edges of the substrate 21 and the sealing substrate 23 may be bonded with a sealant 24, such that a space (or cavity) 25 between the substrate 21 and the sealing substrate 23 is sealed (e.g., hermetically sealed) from an ambient environment. Although not illustrated, an absorbent or filler may be disposed in the space 25.

Referring to FIG. 2, an organic light-emitting display apparatus 2 may include, for example, an organic light-emitting unit 22 formed on a substrate 21 and a sealing film 26 disposed thereon to seal (e.g., hermetically seal) the organic light-emitting unit 22.

The organic light-emitting display apparatus 2 of FIG. 2 is different from the organic light-emitting display apparatus of FIG. 1, as it includes the thin sealing film 26 instead of the sealing substrate 23. In this manner, the sealing film 26 may protect the organic light-emitting unit 22 from external gases (e.g., oxygen, nitrogen, etc.), moisture, and/or other contaminants by covering the organic light-emitting unit 22. For example, the sealing film 26 may have a structure in which an inorganic layer formed of any suitable inorganic material, such as, for instance, silicon oxide, silicon nitride, etc., and an organic layer formed of any suitable organic material, such as, for instance, epoxy, polyimide, etc., are alternatingly deposited. As such, although sealing film 26 is shown as a single layer, the sealing film 26 may have a multilayer structure including, for example, a plurality of the inorganic layers and/or a plurality of the organic layers.

According to exemplary embodiments, the organic layer may be formed of a polymer, and may be a single layer or multilayer formed of any one of polyethylene terephthalate, polyimide, polycarbonate, epoxy, polyethylene, polyacrylate, etc. For example, the organic layer may be formed of polyacrylate and may include a polymerized monomer composition including a diacrylate-based monomer and a triacrylate-based monomer. A monoacrylate-based monomer may be further included in the monomer composition. Also, a known photoinitiator, such as 2,4,6-trimethylbenzoyldiphenyl phosphine oxide (TPO), may be further included in the monomer composition. It is contemplated, however, that any other suitable material(s) and/or combination of materials may be utilized.

In exemplary embodiments, the inorganic layer may be a single layer or multilayer including metal oxide, metal nitride, etc. For example, the inorganic layer may include any one of silicon nitride ($Si_xN_y$), aluminum oxide ($Al_xO_y$), silicon oxide ($Si_xO_y$), titanium oxide ($Ti_xO_y$), etc., and/or the like.

An uppermost layer of the sealing film 26 exposed to the ambient environment may be formed of an inorganic layer in order to prevent (or otherwise reduce) the penetration of moisture and/or any other contaminants into the organic light-emitting unit 22. The sealing film 26 may include at least one "sandwich" structure, in which at least one organic layer is disposed between at least two inorganic layers. Also, the sealing film 26 may include at least one "sandwich" structure, in which at least one inorganic layer is disposed between at least two organic layers.

According to exemplary embodiments, the sealing film 26 may sequentially include a first inorganic layer, a first organic layer, and a second inorganic layer, which may be disposed on an upper surface of the organic light-emitting unit 22. Also, the sealing film 26 may sequentially include a first inorganic layer, a first organic layer, a second inorganic layer, a second organic layer, and a third inorganic layer, which may be disposed on an upper surface of the organic light-emitting unit 22. Furthermore, the sealing film 26 may sequentially include a first inorganic layer, a first organic layer, a second inorganic layer, a second organic layer, a third inorganic layer, a third organic layer, and a fourth inorganic layer, which may be disposed on an upper surface of the organic light-emitting unit 22. It is noted, however, that the aforementioned "sandwich" structures may include any suitable number of organic and/or inorganic layers.

Although not illustrated, a metal halide layer including, for instance, lithium fluoride ($Li_xF_y$) may be disposed between the organic light-emitting unit 22 and the first inorganic layer of the sealing film 26. The metal halide layer may protect the organic light-emitting unit 22 from damage caused when, for instance, the first inorganic layer is formed thereon via, for example, one or more sputtering, plasma, etc., deposition processes.

According to exemplary embodiments, the first organic layer may have a surface area smaller than the surface area of the second inorganic layer. To this end, the second organic layer may also have a surface area smaller than that the surface area of the third inorganic layer. Also, the first organic layer may be completely covered by the second inorganic layer, and the second organic layer may also be completely covered by the third inorganic layer. In this manner, underlying layers of the sealing film 26 may be completely covered by overlaying layers of the sealing layer 26. Additionally (or alternatively), the sealing film 26 may optionally include a film structure including low-melting glass, such as, for instance, tin oxide ($Sn_xO_y$), etc.

Figure 3:
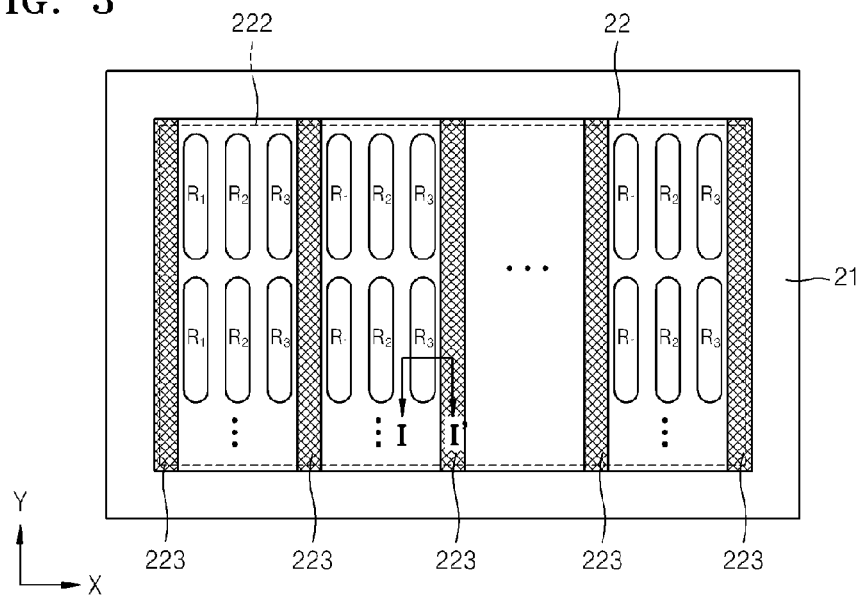
FIG. 3 is a plan view of an organic light-emitting unit of the display apparatuses of FIGS. 1 and 2, according to exemplary embodiments.
Figure 4:
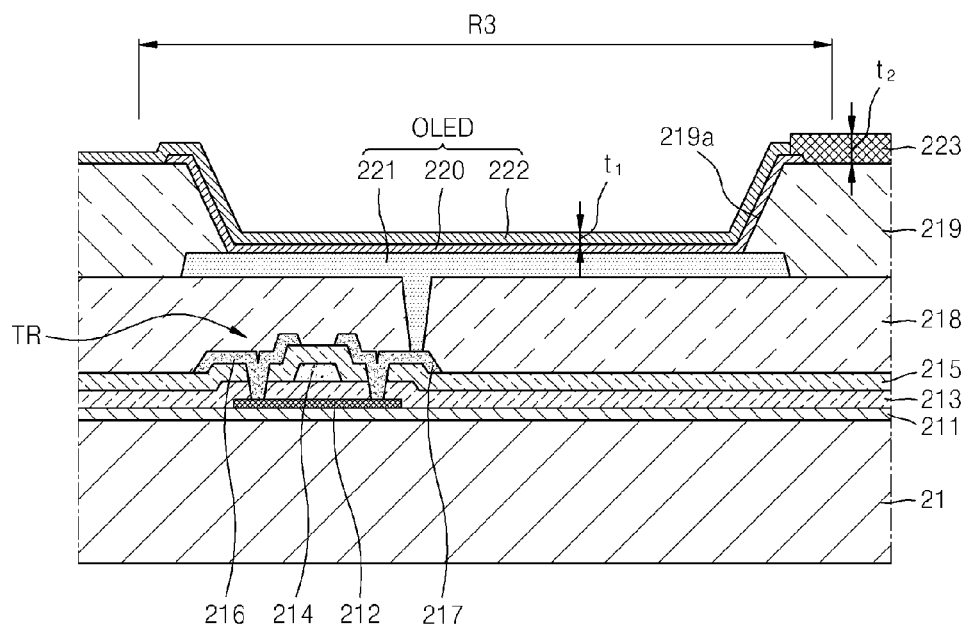
FIG. 4 is a cross-sectional view of the organic light-emitting unit of FIG. 3 taken along sectional line I-I', according to exemplary embodiments.

FIG. 3 is a plan view of the organic light-emitting unit 22 of FIGS. 1 and 2, according to exemplary embodiments. FIG. 4 is a cross-sectional view of the organic light-emitting unit of FIG. 3 taken along sectional line I-I'. It is noted that, in FIG. 3, a portion of light-emitting regions R1, R2 and R3 and auxiliary electrodes 223 of the organic light-emitting unit 22 are illustrated. To this end, the light-emitting regions R1, R2 and R3 and the auxiliary electrodes 223 may be further formed in the same manner as FIG. 3 in other portions of the organic light-emitting unit 22, which are not illustrated in FIG. 3.

Referring to FIG. 3, the plurality of light-emitting regions R1, R2 and R3 may be arranged in the organic light-emitting unit 22. The light-emitting regions R1, R2, and R3 may be regions configured to emit at least one color of light, such as red, green, and blue light, and, thereby, may include an organic light-emitting layer disposed therein. It is noted, however, that light-emitting regions R1, R2, and R3 may be configured to emit any other suitable color, such as, for instance, white, purple, magenta, yellow, orange, etc.

According to exemplary embodiments, adjacent light-emitting regions among the light-emitting regions R1, R2, and R3 arranged in a first direction (e.g., an X direction) may emit different colors. Also, the light-emitting regions R1, R2 and R3 arranged in a second direction (e.g., a Y direction) may emit the same color. It is contemplated, however, that any other suitable arrangement may be utilized.

In exemplary embodiments, each light-emitting region may constitute a sub-pixel, such that three light-emitting regions may be combined to constitute a pixel. For example, light-emitting regions R1, R2, and R3 may be configured to respectively emit red, green, and blue light, and may be sub-pixels of a pixel. It is contemplated, however, that pixels may include any suitable number and/or configuration of sub-pixels. To this end, the auxiliary electrode 223 may be disposed outside of the pixels. That is, the auxiliary electrode 223 may be disposed between adjacent pixels that are adjacent to one another in the first direction. To this end, the auxiliary electrode 223 may be disposed in a non-light-emitting region so as not to decrease the light-emitting efficiency of the organic light emitting unit 22. As illustrated in FIG. 3, the auxiliary electrode 223 may extend in the second direction and may be disposed in a non-light-emitting region between the light-emitting regions R1, R2, and R3 having different light-emitting colors. It is contemplated, however, that any other suitable arrangement may be utilized.

Although not illustrated in FIG. 3, the organic light-emitting unit 22 may further include a transmission window. The transmission window may be a window through which light may radiate from the sealing substrate 25 or the sealing film 26 from the substrate 21. In this manner, the transmission window may correspond to a part having a transparent material stacked (or otherwise disposed) on the sealing substrate 25 or the sealing film 26. When the transmission window is included, the organic light-emitting display apparatuses 1 and 2 may be used as transparent display apparatuses.

The auxiliary electrode 223 may improve the voltage drop of a counter electrode 222 configured to provide a voltage to the organic light-emitting unit 22. The counter electrode 222 may be formed on the organic light-emitting unit 22. When the organic light-emitting display apparatuses 1 and 2 are top emission type display apparatuses in which light is emitted in a direction of the sealing substrate 23 or the sealing film 26, the counter electrode 222 is transparent to light. Although a thickness of the counter electrode 222 may be decreased or a transparent conductive metal oxide may be used for the light transparency of the counter electrode 222, this may cause a voltage drop due to relatively high sheet resistance. As such, the auxiliary electrode 223 may be formed to be electrically connected to the counter electrode 222 in order to improve the voltage drop of the counter electrode 222.

According to exemplary embodiments, the auxiliary electrode 223 may be formed from any suitable, low-resistance metal material. For example, the auxiliary electrode 223 may include at least one of lithium (Li), calcium (Ca), lithium fluoride/calcium (LiF/Ca), lithium fluoride/aluminum (LiF/Al), aluminum (Al), silver (Ag), magnesium (Mg), ytterbium (Yb), and/or the like. The auxiliary electrode 223 may be formed thicker than the counter electrode 222 so as to decrease the sheet resistance of the counter electrode 222.

Referring to FIG. 4, a buffer layer 211 may be formed on the substrate 21, and a thin film transistor TR (or any other suitable switching component) may be formed on the buffer layer 211. Although only one thin film transistor TR is illustrated in FIG. 4, the sub-pixel may constitute a sub-pixel circuit including at least another thin film transistor and a capacitor in addition to the illustrated thin film transistor TR. It is contemplated, however, that any suitable switching circuit may be utilized to "turn on/off" one or more sub-pixels of a pixel.

According to exemplary embodiments, the substrate 21 may be formed of any suitable transparent material, such as a transparent glass including silicon oxide ($SiO_2$) as a main component. The substrate 21 is not necessarily limited thereto, and, as such, the substrate 21 may be formed of various other materials, such as, for instance, ceramic, a transparent plastic material, a metallic material, and/or the like.

The buffer layer 211 may function to prevent (or otherwise reduce) the diffusion of impurities (e.g., impurity ions) into a top surface of the substrate 21, as well as function to prevent (or otherwise reduce) the penetration of moisture, external gasses, and/or other contaminants and to planarize the surface of the substrate 21. In exemplary embodiments, the buffer layer 211 may be formed of any suitable inorganic material, such as silicon oxide, silicon nitride, silicon oxynitride, aluminum oxide, aluminum nitride, titanium oxide, titanium nitride, etc., and/or an organic material, such as polyimide, polyester, acryl, etc., or a stack thereof. It is noted, however, that the buffer layer 211 is merely optional, and, thereby, may be omitted. If utilized, the buffer layer 211 may be formed via any suitable manufacturing process(es), such as various deposition methods, e.g., one or more plasma enhanced chemical vapor deposition (PECVD) methods, one or more atmospheric pressure CVD (APCVD) methods, one or more low pressure CVD (LPCVD) methods, and/or the like.

According to exemplary embodiments, the thin film transistor TR includes an active layer 212, a gate electrode 214, and source/drain electrodes 216 and 217. A gate dielectric layer 213 configured to insulate the gate electrode 214 and the active layer 212 is disposed between the gate electrode 214 and the active layer 212. The active layer 212 may be formed on the buffer layer 211. An inorganic semiconductor, such as amorphous silicon, polysilicon, etc., or an organic semiconductor may be used as the active layer 212. In exemplary embodiments, the active layer 212 may be formed of an oxide semiconductor. For example, the oxide semiconductor may include an oxide of, for instance, one or more metal elements of Groups 12, 13, and 14, such as zinc (Zn), indium (In), gallium (Ga), tin (Sn), cadmium (Cd), germanium (Ge), hafnium (Hf), etc., and/or combinations thereof.

The gate dielectric layer 213 may be formed on the buffer layer 211 to cover the active layer 212. The gate electrode 214 may be formed on the gate dielectric layer 213. An interlayer dielectric 215 may be formed on the gate dielectric layer 213 to cover the gate electrode 214. The source electrode 216 and the drain electrode 217 may be formed on the interlayer dielectric 215 and may be respectively in contact with the active layer 212 through respective contact holes.

It is contemplated, however, that any suitable structure of the thin film transistor TR may be utilized. For example, the thin film transistor TR may be formed including a top gate structure, but may be formed to have a bottom gate structure in which the gate electrode 214 is disposed under the active layer 212.

Although not illustrated, a pixel circuit including a capacitor, as well as the thin film transistor TR may be formed on the substrate 21.

A passivation layer 218 may be formed to cover the pixel circuit including the thin film transistor TR. The passivation layer 218 may be a single insulating layer or multi-insulating layers having a top surface thereof that is planarized. The passivation layer 218 may be formed of any suitable inorganic material and/or any suitable organic material.

A pixel electrode 221 electrically connected to the pixel circuit including the thin film transistor TR may be formed on the passivation layer 218. The pixel electrode 221 may be formed in the shape of a mutually independent island for each pixel. In this manner, a pixel-defining layer 219 may be formed on the passivation layer 218 to cover edges of the pixel electrode 221. An opening 219a may be formed in the pixel-defining layer 219 to expose a center portion of the pixel electrode 221, except for the edges of the pixel electrode 221. The opening 219a corresponds to a light-emitting region of a pixel, and a top of the remaining pixel-defining layer 219 correspond to a non-light-emitting region of the pixel.

An organic light-emitting layer 220 may be formed on a portion of the pixel electrode 221 that is exposed through the opening 219a. A counter electrode 222 may be formed to cover the organic light-emitting layer 220. In this manner, the combination of the pixel electrode 221, the organic light-emitting layer 220, and the counter electrode 222 may together form (or otherwise constitute) an organic light-emitting device (OLED).

The organic light-emitting layer 220 may be formed of, for instance, a low molecular weight organic material or a polymer organic material. When a low molecular weight organic material is used, a hole injection layer (HIL), a hole transport layer (HTL), an emission layer (EML), an electron transport layer (ETL), and an electron injection layer (EIL) may be stacked in a single or composite structure. The low molecular weight organic material may be formed via vacuum deposition. In this manner, the light-emitting layer 220 may be independently formed for each light emitting region (e.g., each red, green, and blue pixel/sub-pixel regions), and the HIL, the HTL, the ETL, and the EIL may be commonly used in the red, green, and blue light emitting regions as a common layer.

In exemplary embodiments, the HIL may be formed of a phthalocyanine compound, such as copper phthalocyanine, or starburst-type amines, such as tris(4-carbazoyl-9-ylphenyl)amine (TCTA), 4,4',4"-tris-(3-methylphenylphenylamino)triphenylamine (m-MTDATA), 1,3,5-tris[4-(3-methylphenylphenylamino)phenyl]benzene (m-MTDAPB), etc. The HTL may be formed of N,N'-bis(3-methylphenyl)-N,N'-diphenyl-[1,1'-biphenyl]-4,4'-diamine (TPD), N,N'-di(naphthalene-1-yl)-N,N'-diphenyl-benzidine (α-NPD), etc. The EIL may be formed using a material, such as lithium fluoride (LiF), sodium chloride (NaCl), caesium fluoride (CsF), lithium oxide ($Li_xO_y$), barium oxide (BaO), 8-hydroxy-quinolinato lithium (Liq), etc. The ETL may be formed using tris(8-hydroxy-quinolinato)aluminum (Alq3).

In exemplary embodiments, the EML may include a host material and a dopant material. Exemplary host materials may include Alq3, 9,10-di(naphthy-2-yl)anthracene (AND), 3-tert-butyl-9,10-di(naphthy-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4''-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), etc. To this end, exemplary dopant materials may include 4,4'-bis[4-(di-p-tolylamino)styryl]biphenyl (DPAVBi), 9,10-di(naph-2-tyl)anthracene (ADN), 3-tert-butyl-9,10-di(naph-2-tyl)anthracene (TBADN), etc.

According to exemplary embodiments, the pixel electrode 221 may function as a first (e.g., an anode) electrode and the counter electrode 222 may function as a second (e.g., cathode) electrode of the organic light-emitting device OLED. It is contemplated, however, that the polarities of the pixel electrode 221 and the counter electrode 222 may be reversed.

When the pixel electrode 221 functions as an anode electrode, the pixel electrode 222 may include a high work function material, such as indium tin oxide (ITO), indium zinc oxide (IZO), zinc oxide (ZnO), indium (III) oxide ($In_2O_3$), etc. When the organic light-emitting display apparatuses 1 and 2 of FIGS. 1 and 2 are configured as top emission type display apparatuses in which an image is obtained in a direction opposite to the substrate 21, the pixel electrode 221 may further include a reflective layer formed of, for instance, silver (Ag), magnesium (Mg), aluminium (Al), platinum (Pt), palladium (Pd), gold (Au), nickel (Ni), neodymium (Nd), iridium (Ir), chromium (Cr), lithium (Li), ytterbium (Yb), calcium (Ca), etc.

When the counter electrode 222 functions as a cathode electrode, the counter electrode 222 may be formed of any suitable metal, such as Ag, Mg, Al, Pt, Pd, Au, Ni, Nd, Ir, Cr, Li, and Ca. To this end, when the organic light-emitting display apparatuses 1 and 2 of FIGS. 1 and 2 are configured as top emission type display apparatuses, the counter electrode 222 is formed transparent to light. In exemplary embodiments, the counter electrode 222 may include a transparent conductive metal oxide, such as ITO, IZO, zinc tin oxide (ZTO), ZnO, $In_2O_3$, etc. It is also contemplated that the counter electrode 222 may be formed as a thin film including, for instance, Li, Ca, LiF/Ca, LiF/Al, Al, Ag, Mg, Yb, etc. For example, the counter electrode 222 may be formed in a single layer or multilayer structure including Mg:Ag, Ag:Yb, and/or Ag. The counter electrode 222, different from the pixel electrode 221, may be formed to allow a common voltage to be applied to all pixels. In exemplary embodiments, the counter electrode 222 may have a thickness $t_1$ ranging from about 100 Å to about 150 Å.

According to exemplary embodiments, the auxiliary electrode 223 is electrically connected to the counter electrode 222. The auxiliary electrode 223 may be prepared on the pixel-defining layer 219 in a region corresponding to the non-light-emitting region. The auxiliary electrode 223 may be formed of the same material as the counter electrode 222. It is noted, however, that the auxiliary electrode 223 may have a thickness $t_2$ larger than a thickness $t_1$ of the counter electrode 222. In exemplary embodiments, the thickness $t_2$ of the auxiliary electrode 223 may be about 5 times the thickness $t_1$ of the counter electrode 222. In exemplary embodiments, the auxiliary electrode 223 may have a thickness $t_2$ ranging from about 500 Å to about 5,000 Å. The auxiliary electrode 223 may be non-transparent to light.

The counter electrode 222 and the auxiliary electrode 223 may be formed using a small mask scanning (SMS) deposition method, which is described in more detail in the proceeding paragraphs. To this end, it is noted that the counter electrode 222 and the auxiliary electrode 223 may be formed via a single deposition process using the SMS deposition method. The counter electrode 222 and the auxiliary electrode 223 may be formed having different thicknesses, e.g., thicknesses $t_1$ and $t_2$, respectively.

As previously described, the organic light-emitting layer 220 may be formed in the opening 219a to form separate light-emitting materials for each sub-pixel. It is contemplated, however, that any other suitable arrangement may be utilized. The organic light-emitting layer 220 may be commonly formed on the entire pixel-defining layer 219 regardless of a position of the pixel/sub-pixel. In this manner, the organic light-emitting layer 220, for example, may be formed by vertically stacking or mixing layers including different light-emitting materials that emit, for instance, red, green, and blue light. When the organic light-emitting layer 220 is configured to emit white light, a combination of different colors may be possible. Also, a color conversion layer for converting the emitted white light into a predetermined color or a color filter may be further included.

Figure 5:
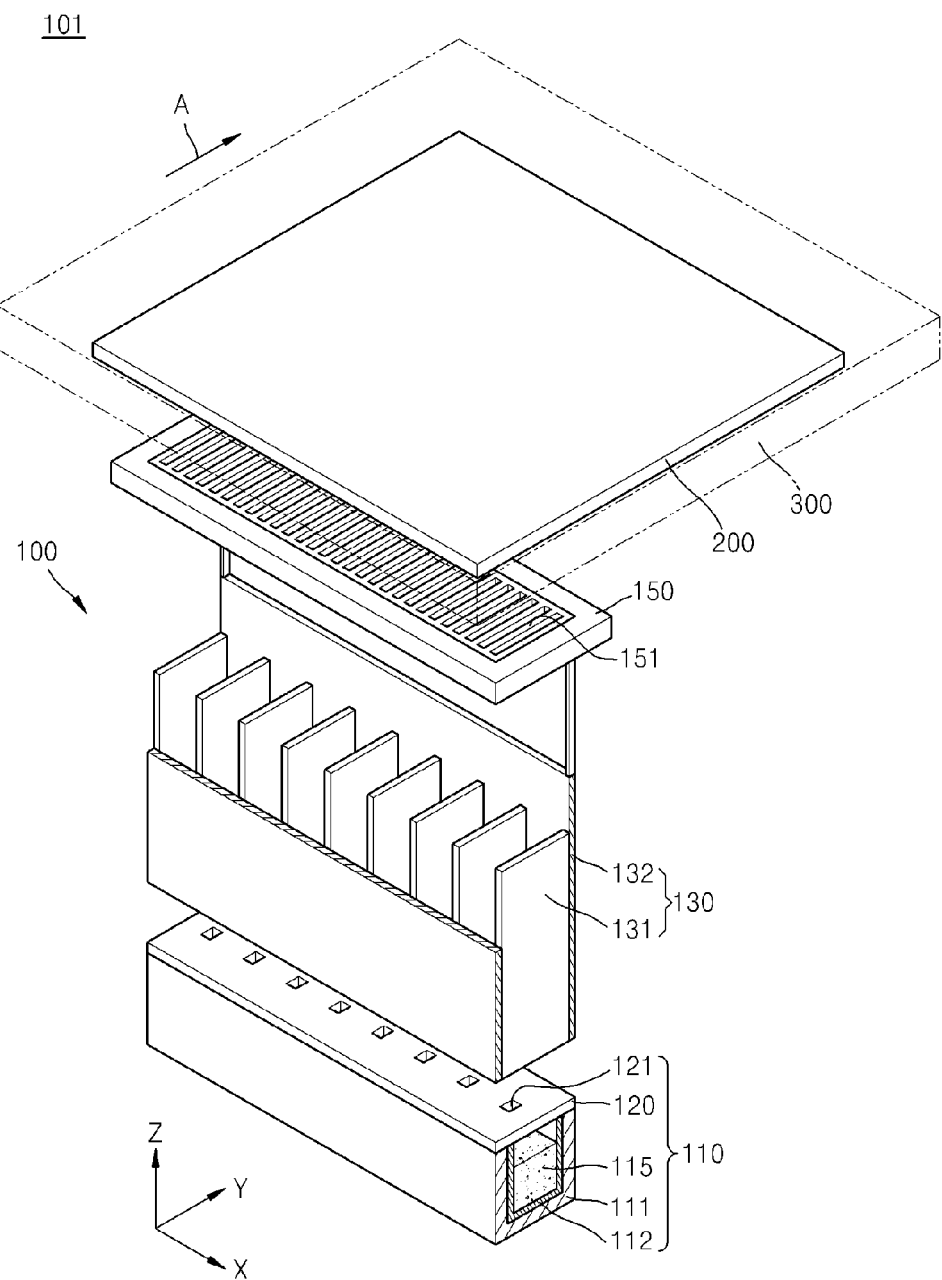
FIG. 5 is a schematic diagram of a thin film deposition apparatus, according to exemplary embodiments.
Figure 6:
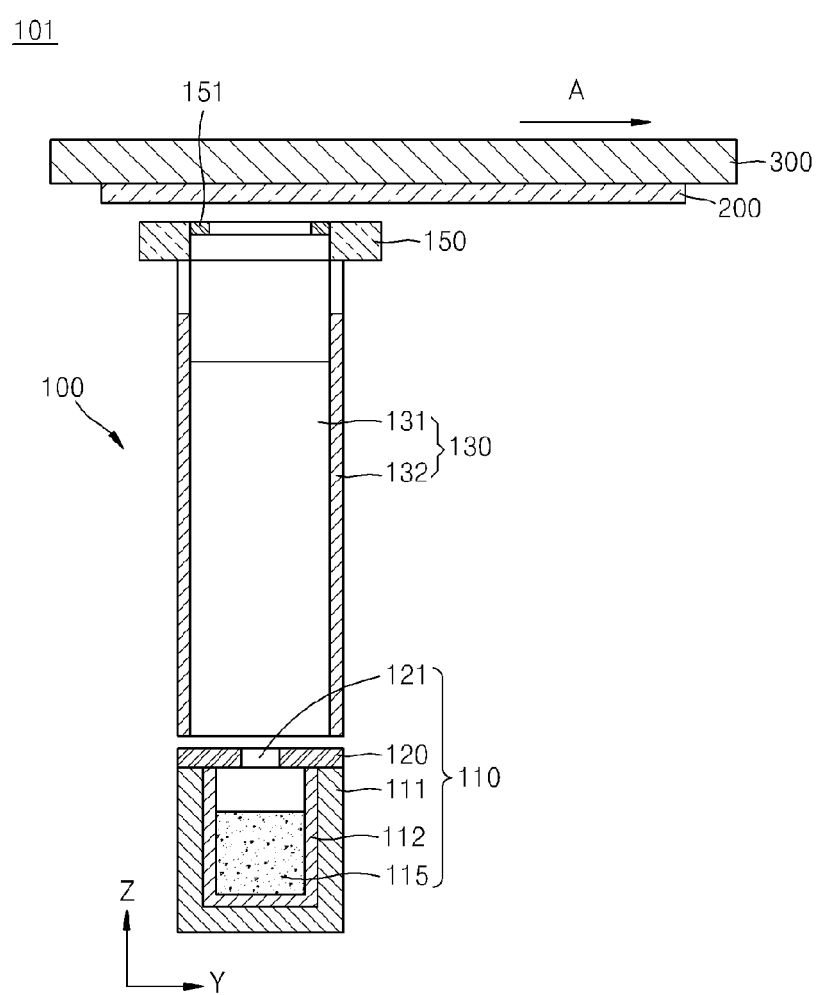
FIG. 6 is a schematic sectional view of the thin film deposition apparatus of FIG. 5, according to exemplary embodiments.

FIG. 5 is a schematic diagram of a thin film deposition apparatus 101, according to exemplary embodiments. FIG. 6 is a schematic sectional view of the thin film deposition apparatus 101 of FIG. 5.

Referring to FIGS. 5 and 6, the thin film deposition apparatus 101 includes a thin film deposition assembly 100 and a substrate mounting unit 300. It is noted that a chamber is not shown in FIGS. 5 and 6 for illustrative/descriptive convenience; however, the configurations of FIGS. 5 and 6 may be disposed in a chamber in which a suitably pressurized environment (e.g., vacuum environment) is maintained. In this manner, the pressurized environment may be utilized to secure the linearity of deposition of the material(s) to be deposited.

According to exemplary embodiments, deposition may be performed while the thin film deposition assembly 100 and a substrate 200 move relative to each other. In other words, deposition may be performed (e.g., continuously performed) while the substrate 200 (which may be disposed to face the thin film deposition assembly 100) moves along a Y-axis direction, i.e., an A direction. That is, deposition may be performed by a scanning method while the substrate 200 is mounted on the substrate mounting unit 300 and moves in the A direction of FIG. 5. In exemplary embodiments, the A direction, e.g., a direction in which the substrate 200 moves during deposition, may be referred to as a "scan direction" of the deposition process.

Although it is illustrated in FIG. 5 that deposition is performed while the substrate 200 moves in the scan direction, e.g., the A direction, in a chamber (not shown), it is also contemplated that deposition may be performed while the substrate 200 is fixed and the thin film deposition assembly 100 moves in the scan direction. To this end, it is also contemplated that the substrate 200 and the thin film deposition assembly 100 may move in the scan direction. As such, a method in which deposition is performed while the substrate 200 moves relative to the thin film deposition assembly 100 may be referred to as an "SMS deposition method."

According to exemplary embodiments, the substrate mounting unit 300 may hold the substrate 200 and may move relative to the thin film deposition assembly 100. Referring to FIG. 5, the substrate mounting unit 300 may move in the scan direction, e.g., the A direction, with respect to the thin film deposition assembly 100.

The substrate 200 is denoted as a material subjected to deposition, and may be disposed to face the thin film deposition assembly 100. The substrate 200 may be a substrate for a flat panel display apparatus; however, the thin film deposition apparatus 101 may be utilized to fabricate any suitable device. In exemplary embodiments, a large-sized substrate, in which the plurality of flat panel display apparatuses may be formed, may be used as the substrate 200. It is noted that various material layers may be stacked (or otherwise formed) on the substrate 200.

According to exemplary embodiments, the thin film deposition assembly 100 includes a deposition source 110, a shielding plate assembly 130, and a mask frame 150.

The deposition source 110 may be configured to discharge a deposition material 115. The deposition source 110 may include a crucible 112, in which the deposition material is stored, and an insulation block 111 surrounding the crucible 112. The insulation block 111 may inhibit (or otherwise reduce) the dissipation of heat from the crucible 112 to the ambient environment. A heater (not shown) configured to heat the crucible 112 may be included in the insulation block 111.

According to exemplary embodiments, a deposition source nozzle unit 120 may be disposed at one side of the deposition source 110 facing the substrate 200. A plurality of deposition nozzles 121 may be included in the deposition nozzle unit 120, and may be spaced apart from one another along an X-axis direction. It is contemplated, however, that any other suitable arrangement of deposition nozzles 121 may be utilized. The deposition material 115 may be evaporated in the deposition source 110 and caused to move toward the substrate 200 so as to be a vaporized material to be deposited on the substrate 200 by passing through the deposition source nozzles 121 of the deposition source nozzle unit 120.

Although the deposition source 110 has been described as shown in FIGS. 5 and 6, it is contemplated that any suitable type and/or method of realizing the deposition source 110 may be used to discharges the deposition material 115.

The shielding plate assembly 130 may be disposed between the deposition source 110 and the mask frame 150. The shielding plate assembly 130 may include a shielding plate 131 and a shielding plate frame 132.

The shielding plate 131 may be configured to secure the linearity of deposition of the deposition material 115. In this manner, a plurality of shielding plates 131 may be included and spaced apart from one another in the X-axis direction. In exemplary embodiments, the shielding plates 131 may be disposed at equal spacing; however, it is contemplated that any suitable spacing arrangement may be utilized. To this end, each shielding plate 131 may be disposed between adjacent deposition source nozzles 121. That is, a deposition source nozzle 121 may be disposed between adjacent shielding plates 131.

According to exemplary embodiments, the shielding plate frame 132 may be included on each side of the shielding plates 131 to fix positions of the shielding plates 131 and guide a moving path of the deposition material 115 in the Z-axis direction in order for the deposition material 115 discharged from the deposition source nozzles 121 not to be dispersed in the Y-axis and X-axis directions beyond the slotted regions disposed between adjacently disposed shielding plates 131.

The mask frame 150 is disposed between the deposition source 110 and the substrate mounting unit 300, or the shielding plate assembly 130 and the substrate mounting unit 300. The mask frame 150 may be configured to support a mask 151. The mask frame 150 may be prepared in the form of a widow frame, and the mask 151 may be disposed on (or otherwise combined with) an inner side of the mask frame 150. In exemplary embodiments, the mask 151 may be formed of a thin sheet of metal. The mask 151 may include patterning slits corresponding to a deposition pattern to be formed on the substrate 200. To this end, the mask 151 may be formed with a surface smaller than a corresponding surface of the substrate 200.

According to exemplary embodiments, a pattern with different thicknesses may be formed by a deposition process using the thin film deposition apparatus 101. That is, because the substrate 200 having a pattern formed thereon moves in the scan direction A relative to the thin film deposition assembly 100 during deposition processing, a thick pattern may be formed as a length of the patterning slit increases according to a moving direction of the substrate 200.

Figure 7:
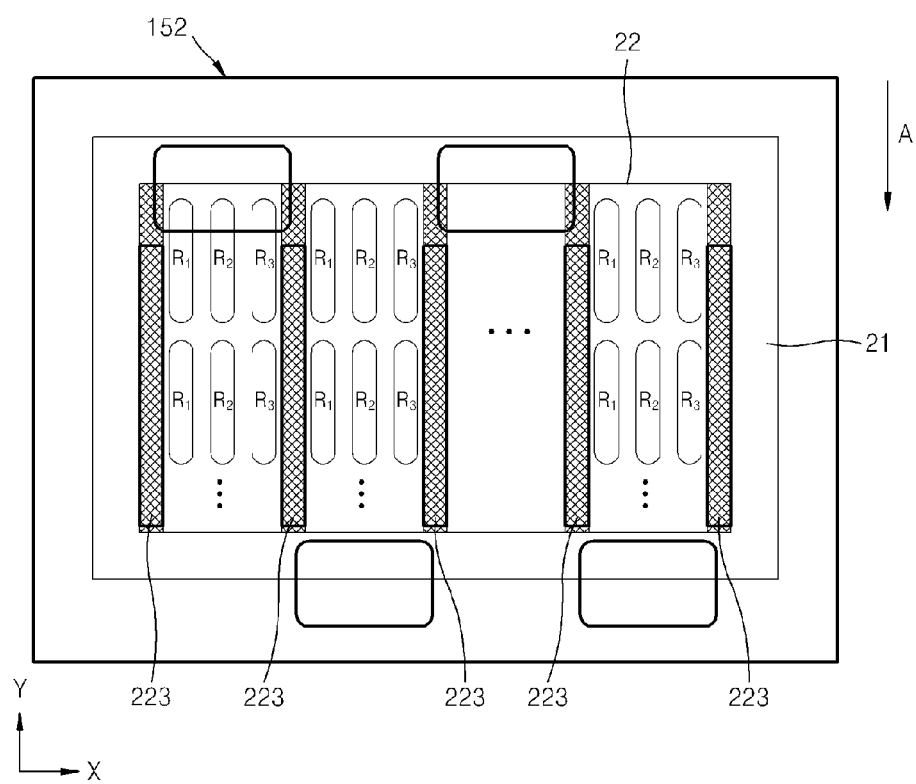
FIG. 7 is a plan view of a mask disposed over the organic light-emitting unit of FIG. 3, according to exemplary embodiments.
Figure 8:
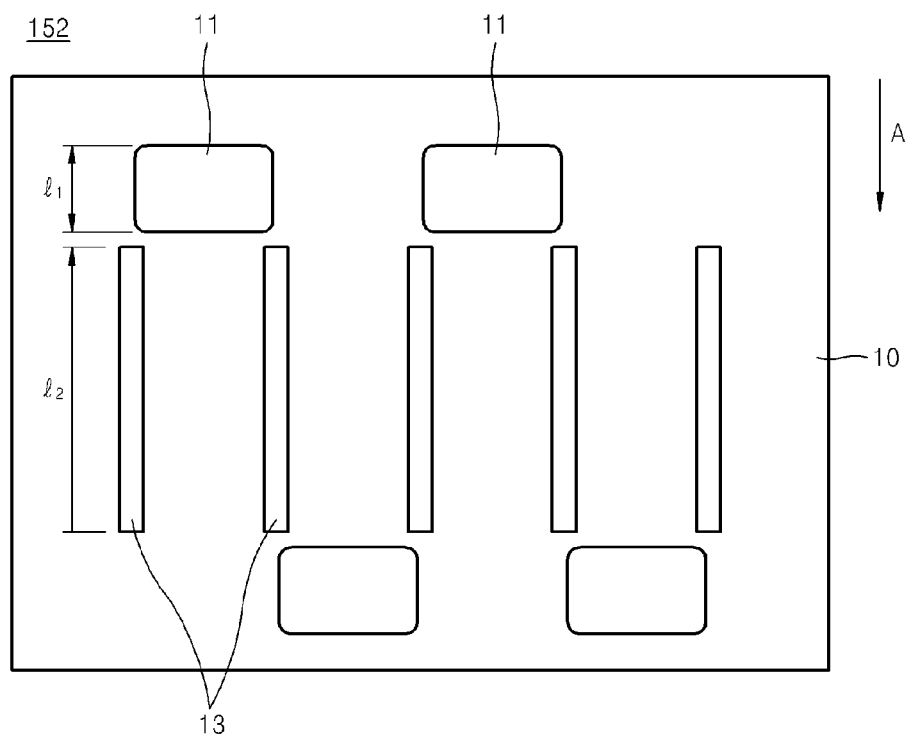
FIG. 8 is a plan view of the mask of FIG. 7, according to exemplary embodiments.

FIG. 7 illustrates a mask 152 disposed over the organic light-emitting unit 22 of FIG. 3, according to exemplary embodiments. It is noted that mask 152 may be configured to facilitate patterning of the counter electrode 222 and the auxiliary electrode 223. FIG. 8 is a plan view of the mask 152 of FIG. 7, according to exemplary embodiments.

Referring to FIGS. 7 and 8, the mask 152 includes, in a mask sheet 10, first patterning slits 11 for forming the counter electrodes 222 and second patterning slits 13 for forming the auxiliary electrodes 223. A relative moving direction of the substrate 21 with respect to the mask 152 is denoted as the scan direction, e.g., the A direction, for descriptive convenience.

Figure 12:
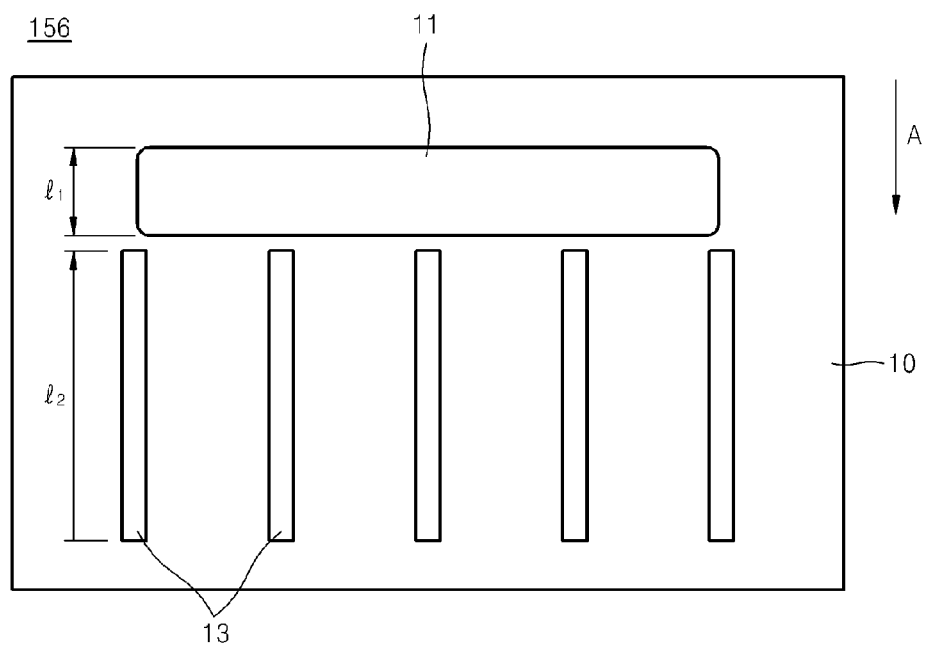

As seen in FIGS. 7 and 8, to form the counter electrode 222, the first patterning slit 11 may be formed by an opening to allow a common electrode to be formed in association with a pixel area including the three light-emitting regions R1, R2, and R3. It is contemplated, however, that alternative configurations may be utilized. For instance, as illustrated in FIG. 12, a patterning slit 11 may be formed in mask sheet 10, such that an opening of patterning slit 10 longitudinally extends in a direction orthogonal to the scan direction (A direction) to enable the counter electrode 222 to be formed as a common electrode associated with each light-emitting region R1, R2, and R3 of each pixel. To this end, a plurality of first patterning slits 11 may be formed in mask sheet 10 so as not to be parallel to adjacent pixel areas. That is, adjacent first patterning slits 11 may be offset from one another in the scan direction (A direction) and a direction orthogonal to the scan direction (A direction).

According to exemplary embodiments, the second patterning slit 13 may be formed in mask sheet 10 as an opening corresponding to a non-light-emitting region, e.g., a portion of substrate 21 association with the auxiliary electrode 223. In this manner, the second patterning slit 13 may longitudinally extend in a direction orthogonal to the scan direction (A direction), such that adjacent second patterning slits 13 may be spaced apart from one another in the scan direction (A direction). To this end, the second patterning slits 13 may be spaced apart from the first patterning slits in the scan direction (A direction). For instance, the second patterning slits 13 may be disposed between offset first patterning slits 11, which are offset from one another in the scan direction (A direction). As such, a plurality of second patterning slits 13 may be formed with each second patterning slit 13 forming a stripe in mask sheet 10.

In exemplary embodiments, a length $l_1$ of the first patterning slit 11 in the scan direction (A direction) may be shorter than a length $l_2$ of the second patterning slit 13 in the scan direction (A direction). It is noted that the shorter the length $l_1$ of the first patterning slit 11 in the scan direction (A direction), the smaller the thickness $t_1$ (as seen in FIG. 4) of the counter electrode 222 will be formed. As such, the length $l_1$ of the first patterning slit 11 may be established so that a desired thickness $t_1$ may be achieved for the counter electrode 222. Also, the design may be changed according to a deposition rate and a moving speed of the substrate 21 during one or more manufacturing processes.

As previously mentioned, the length $l_2$ of the second patterning slit 13 in the scan direction (A direction) may be longer than the length $l_1$ of the first patterning slit 11 in the scan direction (A direction). In exemplary embodiments, the length $l_2$ of the second patterning slit 13 may be more than about 5 times the length $l_1$ of the first patterning slit 11. It is also noted that the first patterning slit 11 and the second patterning slit 13 may overlap in the scan direction (A direction) to enable the counter electrode 222 to be electrically and mechanically connected to the auxiliary electrode 223.

According to exemplary embodiments, aspects of the configuration of mask 152 may be modified and/or additionally formed to enable the formation of the counter electrode 222 and the auxiliary electrode 223. FIGS. 9 through 12 are respective plan views of various masks 153, 154, 155 and 156, according to exemplary embodiments. In FIGS. 9 through 12, like reference numerals denote like members, and, thus, to avoid obscuring exemplary embodiments described herein duplicative descriptions are omitted.

Figure 9:
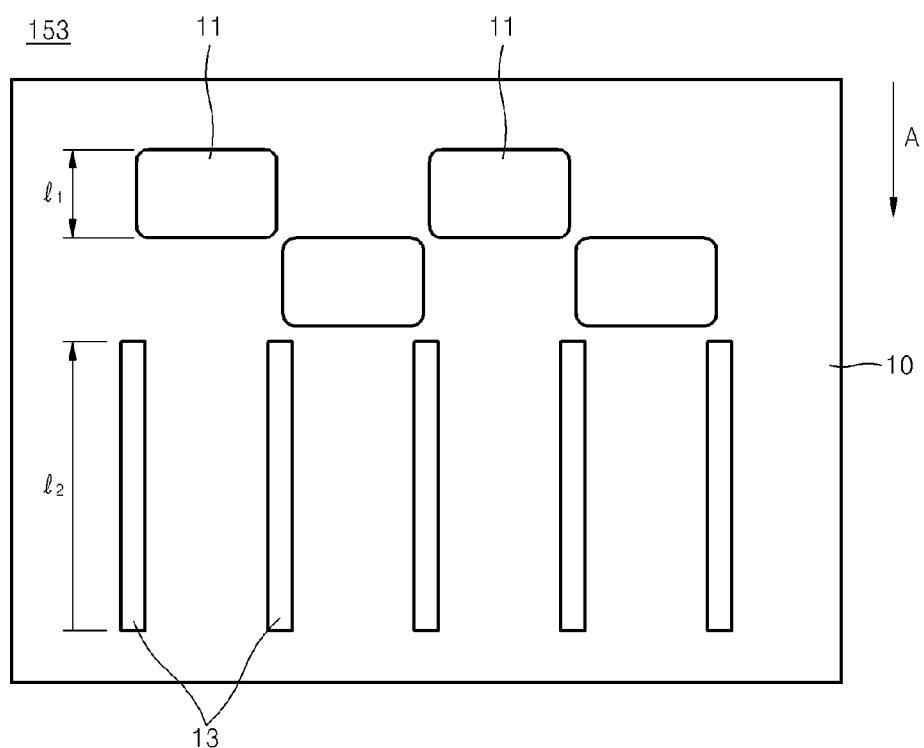
FIGS. 9 through 12 are respective plan views of various masks, according to exemplary embodiments.
Figure 10:
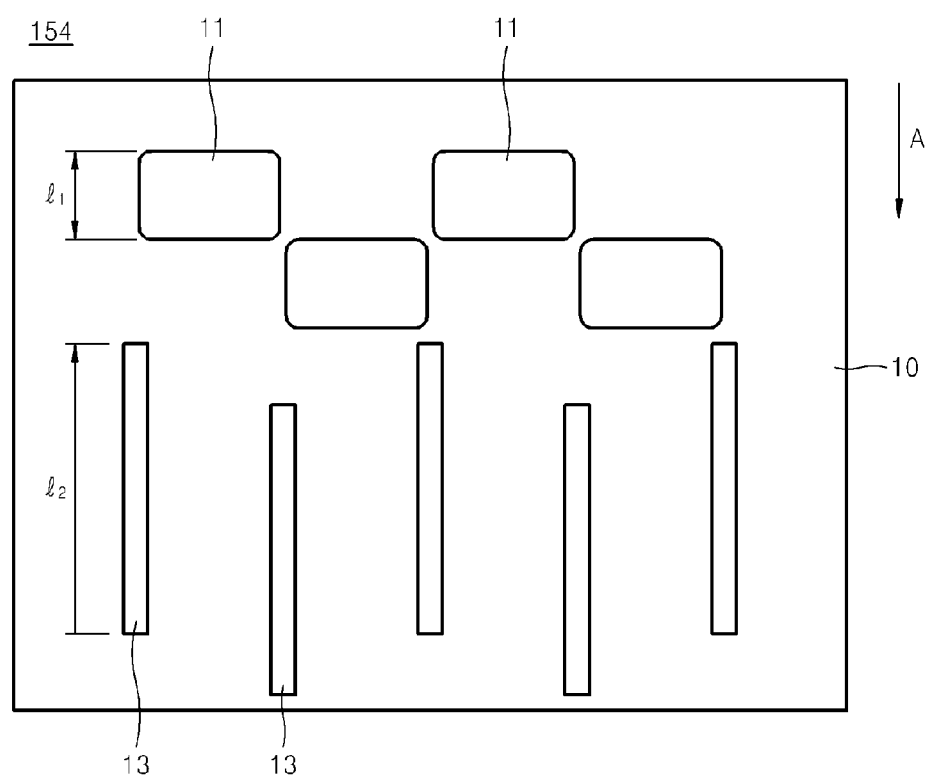
Figure 11:
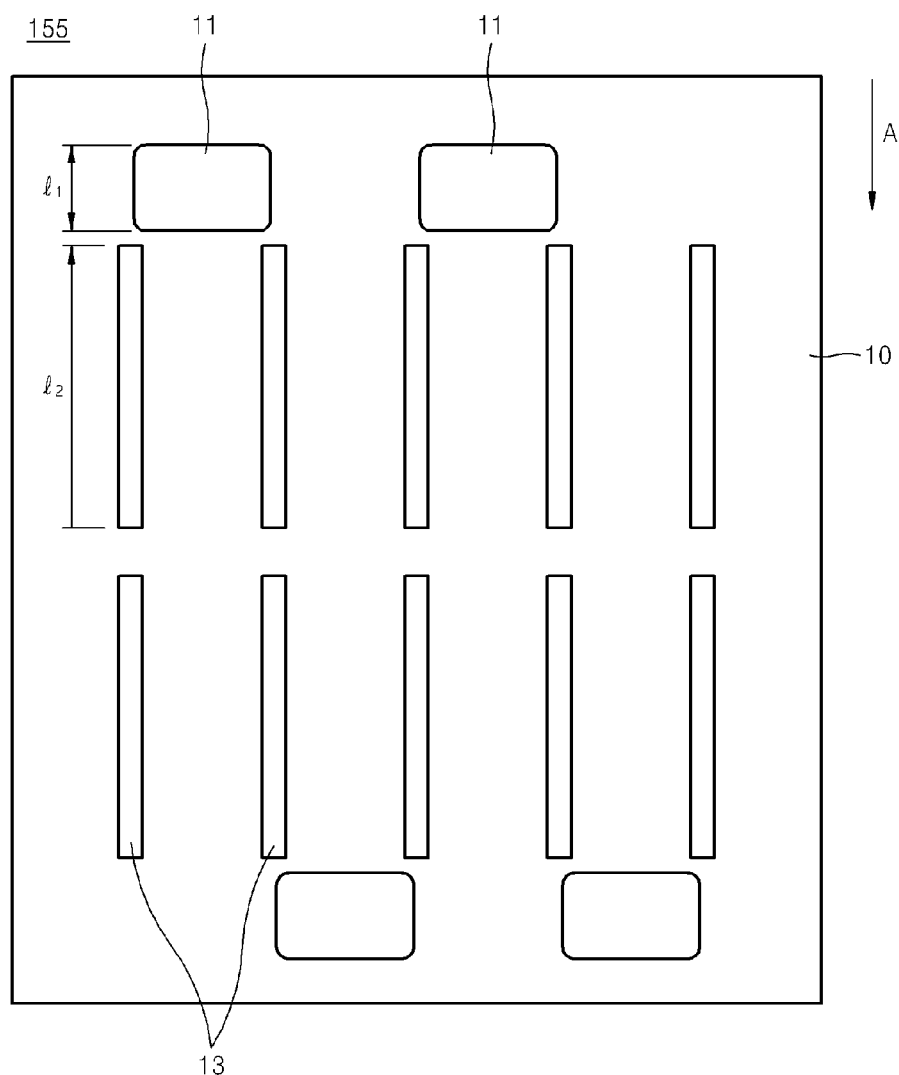

Referring to FIGS. 9 through 12, first patterning slits 11 and second patterning slits 13 formed in the masks 153, 154, 155 and 156 may be formed in parallel or in a zigzag configuration with respect to a direction perpendicular to the scan direction (A direction). For instance, as seen in FIGS. 9 and 10, the first patterning slits 11 are formed in a zigzag configuration, with adjacent first patterning slits 11 offset from one another in the scan direction (A direction). Additionally, as seen in FIG. 10, the second patterning slits 13 may be offset from one another in the scan direction (A direction). Referring to FIG. 11, the second patterning slit 13 may be formed to have a plurality of columns and rows. That is, a first plurality of second patterning slits 13 may be offset from one another in a direction orthogonal to the scan direction (A direction), such that a second plurality of patterning slits 13 (which are also offset from one another in a direction orthogonal to the scan direction (A direction)) may be offset from the first plurality of patterning slits 13 in the scan direction (A direction). It is also noted that the shape and size of the first patterning slits 11 and the second patterning slits 13 may be changed according to an intended design of the counter electrode 222 and the auxiliary electrode 223.

According to exemplary embodiments, because thin film deposition apparatus 101 and a method of manufacturing an organic light-emitting display apparatus (e.g., organic light-emitting display apparatuses 1 and 2) using the same, may form a counter electrode 222 and an auxiliary electrode 223 having different thicknesses in one deposition process, a process of manufacturing the organic light-emitting display apparatus may be simplified. To this end, processing time and expense may be reduced. Also, because relative movement of the thin film deposition assembly 100 with the substrate 200 may be achieved, deposition on a relatively large substrate of an organic light emitting display apparatus using a relative small mask may be possible.

Although certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A method of manufacturing an organic light-emitting display apparatus, the method comprising:
    forming light-emitting regions on a substrate;
    forming an organic light-emitting layer on the light-emitting regions;
    forming, using a mask, a counter electrode on the organic light-emitting layer; and
    forming, using the mask, an auxiliary electrode electrically connected to the counter electrode,
    wherein a thickness of the auxiliary electrode is different from a thickness of the counter electrode, and
    wherein a mask scanning deposition technique is utilized to form the counter electrode and the auxiliary electrode using the mask.

2. The method of claim 1, wherein, during formation of the counter electrode and the auxiliary electrode, the substrate is translated in a scan direction with respect to the mask.

3. The method of claim 2, wherein the mask comprises:
    a first patterning slit associated with forming the counter electrode; and
    a second patterning slit associated with forming the auxiliary electrode.

4. The method of claim 3, wherein a length of the first patterning slit in the scan direction is shorter than a length of the second patterning slit in the scan direction.

5. The method of claim 3, wherein the first patterning slit and the second pattering slit are offset from one another in the scan direction and overlap one another in the scan direction to allow the counter electrode and the auxiliary electrode to be formed in electrical and mechanical connection.

6. The method of claim 1, wherein a thickness of the auxiliary electrode is greater than a thickness of the counter electrode.

7. The method of claim 1, wherein:
    the counter electrode is transparent to light; and
    the auxiliary electrode is opaque to light.

8. The method of claim 1, wherein:
    a non-light-emitting region is disposed between the light-emitting regions; and
    the auxiliary electrode is formed in the non-light-emitting region.

9. The method of claim 1, wherein the counter electrode and the auxiliary electrode are formed of the same material.

10. The method of claim 1, wherein the counter electrode comprises at least one of lithium (Li), calcium (Ca), lithium fluoride (LiF), aluminium (Al), silver (Ag), magnesium (Mg), and ytterbium (Yb).

11. The method of claim 1, wherein surface area of the substrate is larger than surface area of the mask.

12. The method of claim 1, wherein forming the light-emitting regions comprises:
    forming a pixel-defining layer on the substrate; and
    forming openings in the pixel-defining layer corresponding to the light-emitting regions.

* * * * *